(12) United States Patent  
Sandhu

(10) Patent No.: US 7,851,301 B2
(45) Date of Patent: Dec. 14, 2010

(54) SEMICONDUCTOR CAPACITOR STRUCTURE AND METHOD TO FORM SAME

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 433 days.

(21) Appl. No.: 11/495,433

(22) Filed: Jul. 28, 2006

(65) Prior Publication Data

US 2006/0263995 A1 Nov. 23, 2006

Related U.S. Application Data

(62) Division of application No. 10/949,066, filed on Sep. 24, 2004, now abandoned, which is a division of application No. 10/232,976, filed on Aug. 29, 2002, now Pat. No. 6,815,753.

(51) Int. Cl.
*H01L 21/8242* (2006.01)

(52) U.S. Cl. .................. 438/244; 438/243; 438/396; 438/683

(58) Field of Classification Search .......... 438/255, 438/239, 243, 244, 253, 254, 396, 210, 656, 438/683, 964; 257/309, E21.012, E21.013, 257/E21.019

See application file for complete search history.

(56) References Cited

U.S. PATENT DOCUMENTS

| | | | |
|---|---|---|---|
| 5,597,756 A | 1/1997 | Fazan et al. | |
| 5,604,146 A | 2/1997 | Tseng | |
| 5,668,038 A | 9/1997 | Huang et al. | |
| 5,760,434 A | 6/1998 | Zahurak et al. | 257/309 |
| 5,795,805 A | 8/1998 | Wu et al. | |
| 5,913,129 A | 6/1999 | Wu et al. | |
| 6,004,857 A | 12/1999 | Hsiao et al. | 438/396 |
| 6,090,655 A | 7/2000 | Zahurak et al. | 438/239 |
| 6,100,200 A | 8/2000 | Van Buskirk et al. | |
| 6,188,097 B1 | 2/2001 | Derderian et al. | 257/309 |
| 6,306,699 B1 | 10/2001 | Matsubara et al. | |
| 6,319,769 B1 | 11/2001 | Cho | 438/255 |
| 6,323,514 B1 | 11/2001 | Kao | |
| 6,472,322 B2 | 10/2002 | Juengling | |
| 6,538,274 B2 | 3/2003 | Zheng et al. | 257/296 |

*Primary Examiner*—Matthew C Landau
*Assistant Examiner*—Candice Y Chan

(57) ABSTRACT

A semiconductor capacitor structure comprising sidewalls of conductive hemispherical grained material, a base of metal silicide material, and a metal nitride material overlying the conductive hemispherical grained material and the metal silicide material. The semiconductor capacitor structure is fabricated by forming a base of metal silicide material along the sidewalls of an insulative material having an opening therein, forming sidewalls of conductive hemispherical grained material on the metal silicide material, and forming a metal nitride material overlying the conductive hemispherical grained material and the metal silicide material.

4 Claims, 3 Drawing Sheets

US 7,851,301 B2

SEMICONDUCTOR CAPACITOR STRUCTURE AND METHOD TO FORM SAME

This application is a divisional to U.S. patent application Ser. No. 10/949,066, filed Sep. 24, 2004 now abandoned, which is a divisional to U.S. patent application Ser. No. 10/232,976, filed Aug. 29, 2002 now U.S. Pat. No. 6,815,753.

FIELD OF THE INVENTION

This invention relates to a semiconductor device and fabrication thereof and, more particularly, to a semiconductor capacitor structure and fabrication thereof.

BACKGROUND OF THE INVENTION

During semiconductor fabrication of memory devices, to save space, the capacitor of a storage cell must reduce in size and yet maintain adequate capacitance to retain a sufficient charge, such as during Dynamic Random Access Memory (DRAM) operation. There are several approaches to the capacitor design, for example trench capacitors formed in the substrate of a wafer or a stacked capacitor formed above the wafer substrate, to name two.

Regardless of the design chosen, the size of the capacitor must be reduced and yet maintain sufficient capacitance as mentioned previously. Two of the main contributors to capacitance are the surface area of the capacitor plates and the dielectric quality of the insulator separating the capacitor plates. Major engineering efforts have gone into improvements in both areas.

Once the capacitor design is chosen, another factor should be considered and that is the physical connection between the capacitor plate and the underlying conductor (i.e., a conductive plug between the capacitor plate and a source/drain of an access transistor or the source/drain of the access transistor itself). It is desirable that the physical connection between the capacitor plate and the underlying conductor consist of as low resistance as possible and thus provide for low "time at temperature" (DT) flow during fabrication processing.

A significant focus of the present invention is the development of a capacitor having a high surface area within a confined area that possesses a low DT flow. Thus, the present invention comprises a capacitor structure having a high surface area within a confined area that possesses a low DT flow and a method to fabricate same, which will become apparent to those skilled in the art from the following disclosure.

SUMMARY OF THE INVENTION

Exemplary embodiments of the present invention include a capacitor container structure and a method to fabricate same. A capacitor container structure comprises a semiconductor capacitor structure having sidewalls of conductive hemispherical grained material, a base of metal silicide material, and a metal nitride material overlying the conductive hemispherical grained material and the metal silicide material.

A semiconductor capacitor structure is fabricated by forming a base of metal silicide material along the sidewalls of an insulative material having an opening therein, forming sidewalls of conductive hemispherical grained material on the metal silicide material, and forming a metal nitride material overlying the conductive hemispherical grained material and the metal silicide material.

DETAILED DESCRIPTION OF THE INVENTION

An exemplary implementation of the present invention is directed to a unique capacitor structure for use in semiconductor devices and a process to fabricated same, as depicted in FIG. 1-5.

The following exemplary implementation is in reference to a capacitor structure and the fabrication thereof in a semiconductor assembly. While the concepts of the present invention are conducive to the fabrication of a storage capacitor for a Dynamic Random Access Memory (DRAM) device, the concepts taught herein may be applied to other semiconductor devices that would likewise benefit from the use of the capacitor structure and process disclosed herein. Therefore, the depictions of the present invention in reference to a DRAM storage capacitor and the manufacture thereof are not meant to so limit the scope of the invention and the extent to which one skilled in the art might apply the concepts taught hereinafter.

Figure 1:
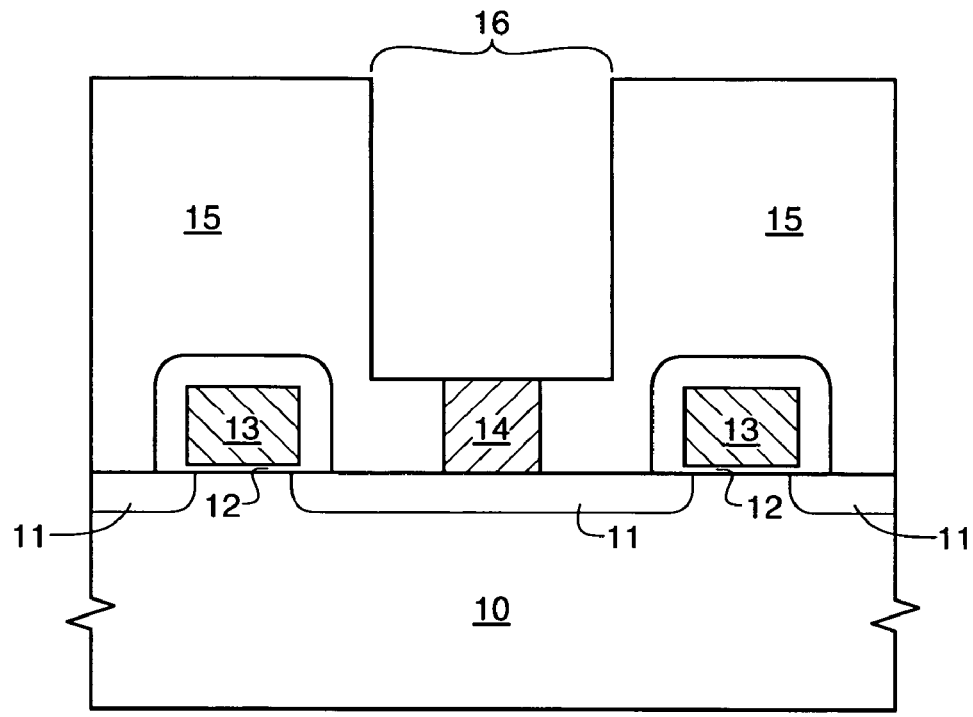
FIG. 1 is a cross-sectional view of a partial memory cell, formed on a semiconductor substrate, comprising access transistors covered with a patterned insulation material in preparation to the formation of an exemplary container shaped capacitor structure.

Referring to FIG. 1, access transistors have been formed on substrate 10, such as a silicon substrate, by methods know to those skilled in the art. The access transistors comprise source/drain regions 11 bridged by transistor gates 13 which overlie transistor gate oxide 12. A conductive plug 14, such as a tungsten plug or polysilicon plug, has also been fabricated to so that it makes physical contact between source/drain region 11 and a subsequently formed capacitor plate, in this example a storage capacitor plate. Also shown in FIG. 1, insulative material 15 is formed and patterned to provide opening 16, which will be used to support the fabrication of the capacitor storage plate.

Figure 2:
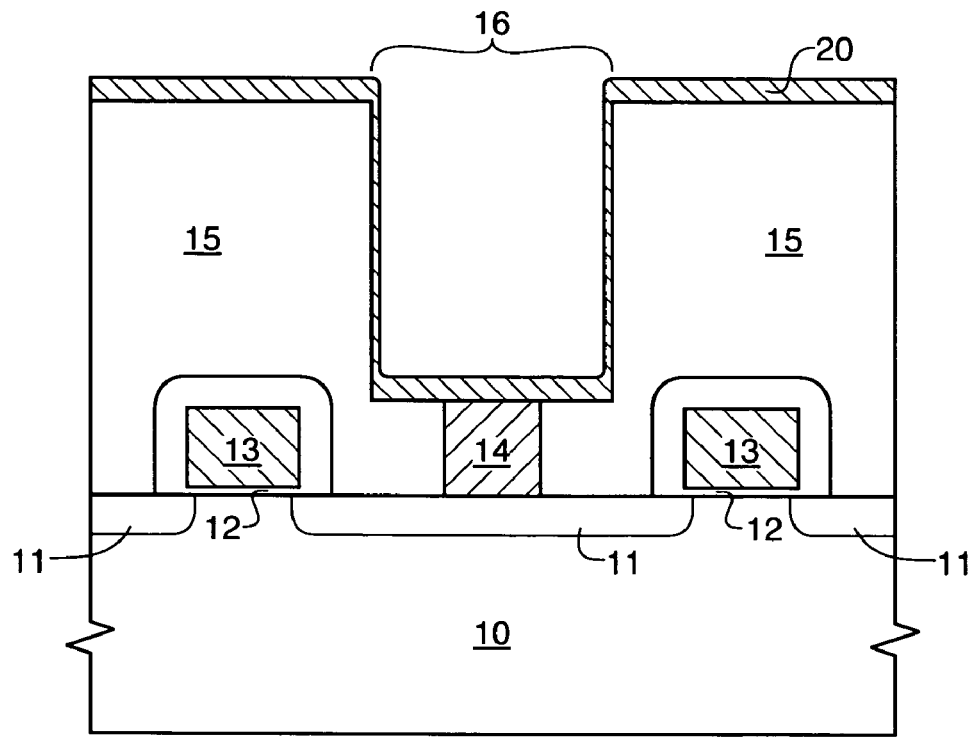
FIG. 2 is a subsequent cross-sectional view taken from FIG. 1 following the formation of a titanium layer.

Referring now to FIG. 2, in a currently preferred embodiment a directional titanium layer 20 is formed on the substantially planar surface of insulative material 15 and on the surface of conductive plug 14, while a minimal amount of titanium is formed on the substantially vertical sidewalls of opening 16. Titanium layer 20 is formed by such techniques as Chemical Vapor Deposition (CVD) or by Ionized Metal Plasma (IMP).

Though titanium is preferred, other metals that will react with silicon to form a conductive silicide, such as cobalt, tungsten, nickel and the like, may be substituted for titanium layer 20. For example, nickel may be selectively deposited on the top of conductive plug 14 (such as a tungsten or polysilicon plug) by an electroplating technique as known to those skilled in the art. Regardless of the metal that is selected, it is desirable that only minimal metal be deposited on the vertical sidewalls of opening 16 to avoid loss of the eventual container capacitor's surface roughness.

Figure 3:
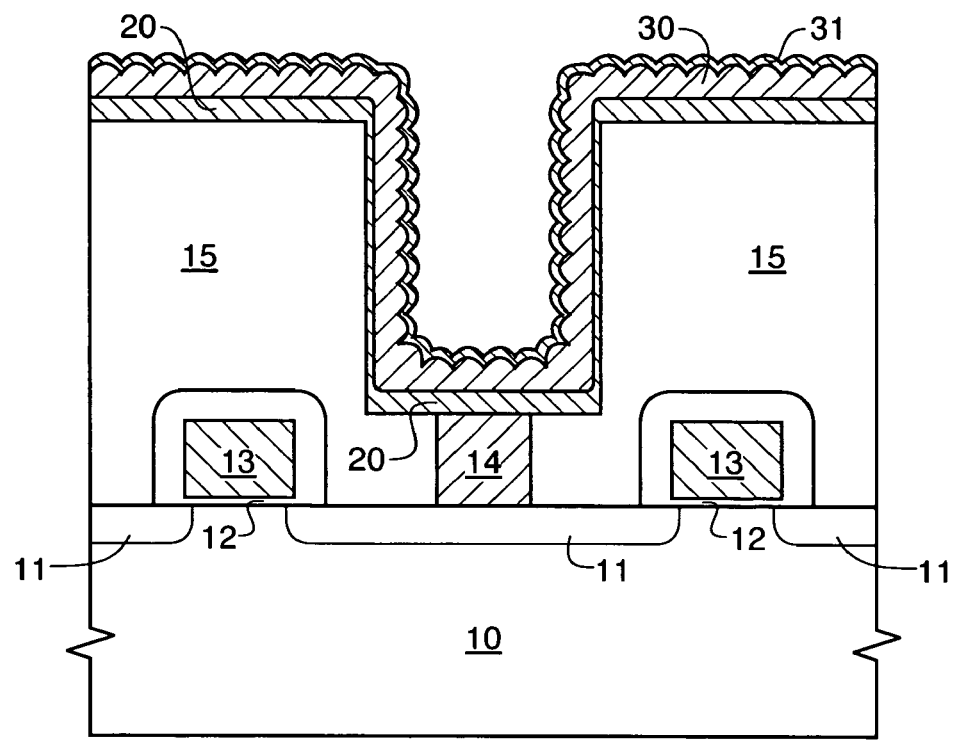
FIG. 3 is a subsequent cross-sectional view taken from FIG. 2 following the formation of HemiSpherical Grain (HSG) silicon over the titanium (Ti) layer.

Referring now to FIG. 3, a HemiSpherical Grain (HSG) polysilicon layer 30 is formed on the surface of titanium layer 20 using methods, such as a standard furnace HSG process or a selective HSG process, known to those skilled in the art. Next, conformal titanium nitride (TiN) layer 31 is formed on HSG polysilicon layer 30. Other conducting films, such as tantalum nitride (TaN), tungsten nitride (WN), etc. may also be used in lieu of a TiN layer.

Figure 4:
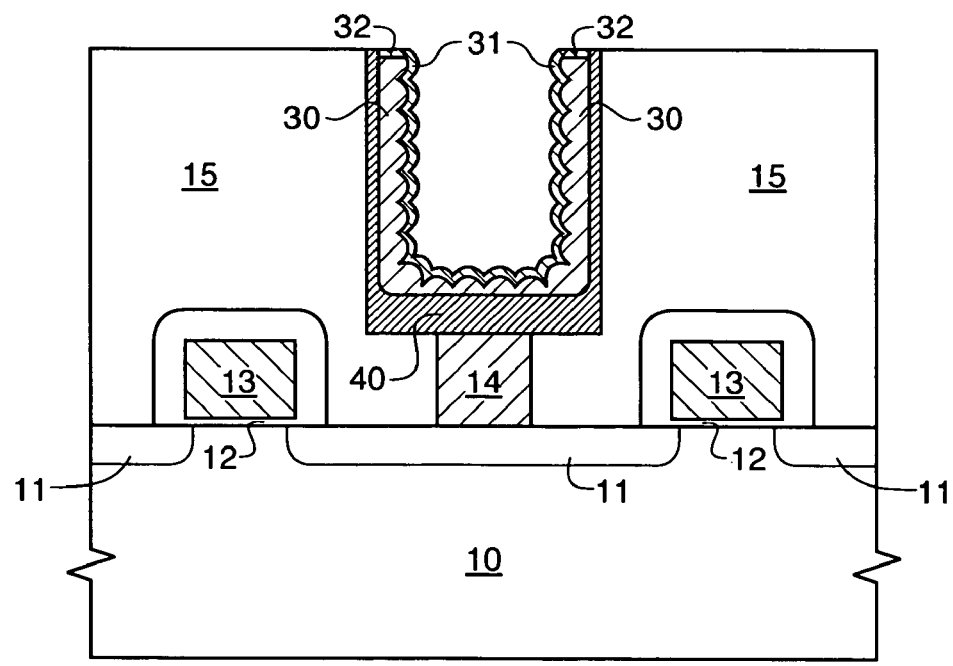
FIG. 4 is a subsequent cross-sectional view taken from FIG. 3 after the formation of a titanium nitride (TiN) layer, followed by a Chemical Mechanical Planarization (CMP) step.

Referring now to FIG. 4, an abrasive planarization, such as a Chemical Mechanical Planarization (CMP) step is performed to remove the portions of titanium layer 20, HSG polysilicon layer 30 and TiN layer 31 that overlie the upper surface of insulative material 15 and thus form a planarized container structure. The CMP step also restores the upper surface of insulative material 15 to a substantially planarized surface. Alternately, the TiN layer may be deposited after the planarized container structure is formed. In this case the TiN layer would be subjected to a CMP step and thus form an additional conformal TiN portion 32.

After the CMP processing, the resulting container shaped structure, comprising underlying titanium layer 20, center lying HSG polysilicon layer 30 and overlying TiN layer 31 (and TiN portion 32 if present), is subjected to a temperature in the order of 600° C. to convert the titanium and HSG polysilicon at the bottom of the container structure to titanium silicide ($TiSi_x$) 40.

Alternately if nickel is used for layer 20, temperatures lower than 600° C., for example temperatures in the range of 400° C.-500° C., will successfully cause $NiSi_x$ formation. The presence of a metal silicide, such as $TiSi_x$ or $NiSi_x$ is a significant feature of the present invention as it provides a low resistance path between TiN layer 31 and conductive plug 14.

Figure 5:
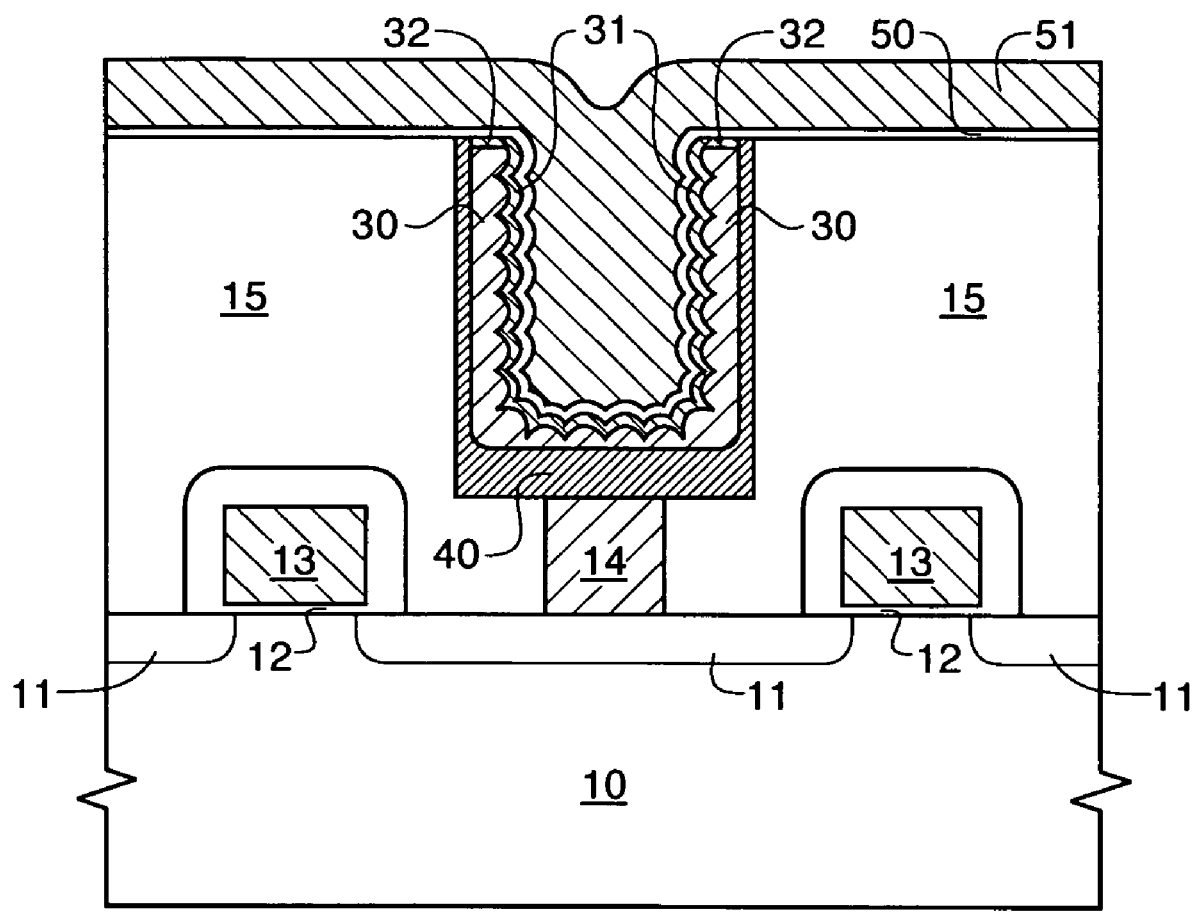
FIG. 5 is a subsequent cross-sectional view taken from FIG. 4 after the silicidation of the HSG silicon overlying the titanium layer, followed by the deposition of a capacitor dielectric layer and a capacitor upper electrode.

Referring now to FIG. 5, substantially conformal capacitor cell dielectric layer 50 is formed over the container structure comprising HSG polysilicon 30 and $TiSi_x$ 40 (both of which are covered with TiN layer 31 and TiN portion 32 if present) and over the surface of adjoining insulative material 15. Next, a top conductive layer 51 is formed on dielectric layer 50 to form a top capacitor electrode.

Fabrication methods known to those skilled in the art are then used to complete the processing of the memory device.

The completed container structure and the fabrication method used therefor may be of various types (i.e., storage capacitors, flash memories, etc.) and may be used in numerous semiconductor applications and particularly in, but not limited to, DRAMs.

It is to be understood that, although the present invention has been described with reference to a preferred embodiment, various modifications, known to those skilled in the art, may be made to the disclosed structure and process herein without departing from the invention as recited in the several claims appended hereto.

What is claimed is:

1. A method to form a capacitor plate structure for a semiconductor device comprising the steps of:
   forming a titanium material on a conductive plug located in an opening of an insulative material;
   forming conductive hemispherical grained polysilicon on the conductive plug and on sidewalls of said insulative material defining said opening;
   converting said titanium material and said conductive hemispherical grained polysilicon residing on the conductive plug to titanium silicide; and
   forming a titanium nitride material that is directly overlying and in contact with said conductive hemispherical grained material and said titanium silicide material.

2. The method of claim 1, wherein said step of converting comprises subjecting said titanium material and said conductive hemispherical grained polysilicon to a temperature of approximately 600° C.

3. A method to form a semiconductor device having a capacitor plate structure comprising the steps of
   forming a titanium material on a conductive plug located in an opening in an insulative material;
   forming conductive hemispherical grained polysilicon on the conductive plug and on sidewalls of said insulative material defining said opening;
   converting said titanium material and said conductive hemispherical grained polysilicon residing on the conductive plug to titanium silicide; and
   forming a titanium nitride material that is directly overlying and in contact with said conductive hemispherical grained material, such that the titanium nitride material, conductive hemispherical grained material and said titanium silicide material form the capacitor plate structure.

4. The method of claim 3, wherein said step of converting comprises subjecting said titanium material and said conductive hemispherical grained polysilicon to a temperature of approximately 600° C.

* * * * *

UNITED STATES PATENT AND TRADEMARK OFFICE
CERTIFICATE OF CORRECTION

PATENT NO. : 7,851,301 B2
APPLICATION NO. : 11/495433
DATED : December 14, 2010
INVENTOR(S) : Gurtej S. Sandhu Page 1 of 1

It is certified that error appears in the above-identified patent and that said Letters Patent is hereby corrected as shown below:

In column 4, line 31, in Claim 3, after "steps of" insert -- : --.

Signed and Sealed this
Twenty-second Day of February, 2011

David J. Kappos
*Director of the United States Patent and Trademark Office*